(12) United States Patent
Saito et al.

(10) Patent No.: US 8,232,593 B2
(45) Date of Patent: Jul. 31, 2012

(54) POWER SEMICONDUCTOR DEVICE

(75) Inventors: Wataru Saito, Kawasaki (JP); Syotaro Ono, Yokohama (JP); Hiroshi Ohta, Himeji (JP); Munehisa Yabuzaki, Yokohama (JP); Nana Hatano, Kawasaki (JP); Miho Watanabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 227 days.

(21) Appl. No.: 12/714,002

(22) Filed: Feb. 26, 2010

(65) Prior Publication Data

US 2010/0230745 A1 Sep. 16, 2010

(30) Foreign Application Priority Data

Mar. 16, 2009 (JP) .................................. 2009-63123

(51) Int. Cl.
H01L 29/78 (2006.01)
H01L 29/06 (2006.01)
(52) U.S. Cl. ........ 257/329; 257/488; 257/168; 257/170; 257/E29.262; 257/E29.006
(58) Field of Classification Search .................. 257/329, 257/488, E29.226, E29.006, 168, 170, 487, 257/600
See application file for complete search history.

(56) References Cited

U.S. PATENT DOCUMENTS

| 7,119,379 | B2 | 10/2006 | Ninomiya et al. |
| 7,564,107 | B2 | 7/2009 | Yanagisawa et al. |
| 2003/0209774 | A1* | 11/2003 | Jimbo et al. .................. 257/488 |
| 2004/0173820 | A1* | 9/2004 | Kinoshita et al. ............ 257/200 |
| 2008/0315299 | A1 | 12/2008 | Saito et al. |

FOREIGN PATENT DOCUMENTS

| JP | 56-035463 | 4/1981 |
| JP | 64-059873 | 3/1989 |
| JP | 01-272151 | 10/1989 |
| JP | 06-005841 | 1/1994 |
| JP | 2005-294772 | 10/2005 |
| JP | 2006-41123 A | 2/2006 |
| JP | 2008-147361 A | 6/2008 |

OTHER PUBLICATIONS

Japanese Office Action dated Aug. 19, 2011, filed in Japanese counterpart Application No. 2009-063123, 8 pages (with English translation).

* cited by examiner

Primary Examiner — Cuong Q Nguyen
Assistant Examiner — Cathy N Lam
(74) Attorney, Agent, or Firm — Patterson & Sheridan, LLP

(57) ABSTRACT

A power semiconductor device according to an embodiment of the present invention includes a first semiconductor layer of a first or second conductivity type, a second semiconductor layer of the first conductivity type formed on the first semiconductor layer, a third semiconductor layer of the second conductivity type selectively formed on a surface of the second semiconductor layer, at least one trench formed in a periphery of the third semiconductor layer on the surface of the second semiconductor layer, a depth of a bottom surface of the at least one trench being deeper than a bottom surface of the third semiconductor layer, and shallower than a top surface of the first semiconductor layer, and some or all of the at least one trench being in contact with a side surface of the third semiconductor layer, at least one insulator buried in the at least one trench, a first main electrode electrically connected to the first semiconductor layer, and a second main electrode electrically connected to the third semiconductor layer.

16 Claims, 16 Drawing Sheets

POWER SEMICONDUCTOR DEVICE

CROSS REFERENCE TO RELATED APPLICATION

This application is based upon and claims the benefit of priority from the prior Japanese Patent Application No. 2009-63123, filed on Mar. 16, 2009, the entire contents of which are incorporated herein by reference.

BACKGROUND OF THE INVENTION

1. Field of the Invention

The present invention relates to a power semiconductor device, for example, to a vertical power device such as a vertical diode, a vertical transistor, or the like.

2. Background Art

A vertical power device typically has electrodes on the top and bottom surfaces of a chip. In the OFF state of the vertical power device, a minus voltage is applied to the electrode on the top surface, and a plus voltage is applied to the electrode on the bottom surface. In a vertical diode which is an example of the vertical power device, the electrode on the top surface is an anode electrode, and the electrode on the bottom surface is a cathode electrode. In a vertical MOSFET or a vertical IGBT (Integrated Gate Bipolar Transistor) which is another example of the vertical power device, the electrode on the top surface is a source electrode or an emitter electrode, and the electrode on the bottom surface is a drain electrode or a collector electrode.

In the vertical power device, the vertical diode or the vertical transistor is provided in a device part, while a terminal part is provided in the periphery of the device part so as to prevent a voltage from being applied to the side surfaces of the chip. In the terminal part, an electric field is generated not only in the vertical direction but also in the horizontal direction. Therefore, for the terminal part, a terminal length in the range of twice to four times the thickness of a drift layer that retains a breakdown voltage is needed to prevent the electric field in the horizontal direction from decreasing the breakdown voltage. However, if the terminal length is long, the effective area ratio in the chip decreases and the on-resistance or the on-voltage of the chip increases.

In a well-known structure for shortening the terminal length and increasing the effective area ratio, a deep trench is formed so as to reach a high concentration substrate from the surface of a semiconductor layer (see JP-A 2006-41123 (KOKAI), for example). According to this structure, the decrease of the breakdown voltage in the terminal part can be prevented by insulating the device part and the side surfaces of the chip by the deep trench, and the effective area ratio can be improved by shortening the terminal length to nearly the trench width.

However, it takes a long etching time to form the deep trench. As the trench width becomes narrow, the time becomes longer. On the other hand, if the trench width is wide, the volume of the trench becomes large and it becomes difficult to bury an insulator uniformly in the trench. As a result, voids are generated in the insulator, and a leak current caused by degradation of insulation in the terminal part increases.

SUMMARY OF THE INVENTION

An aspect of the present invention is, for example, a power semiconductor device including a first semiconductor layer of a first or second conductivity type, a second semiconductor layer of the first conductivity type formed on the first semiconductor layer, a third semiconductor layer of the second conductivity type selectively formed on a surface of the second semiconductor layer, at least one trench formed in a periphery of the third semiconductor layer on the surface of the second semiconductor layer, a depth of a bottom surface of the at least one trench being deeper than a bottom surface of the third semiconductor layer, and shallower than a top surface of the first semiconductor layer, and some or all of the at least one trench being in contact with a side surface of the third semiconductor layer, at least one insulator buried in the at least one trench, a first main electrode electrically connected to the first semiconductor layer, and a second main electrode electrically connected to the third semiconductor layer.

DESCRIPTION OF THE EMBODIMENTS

Figure 1:
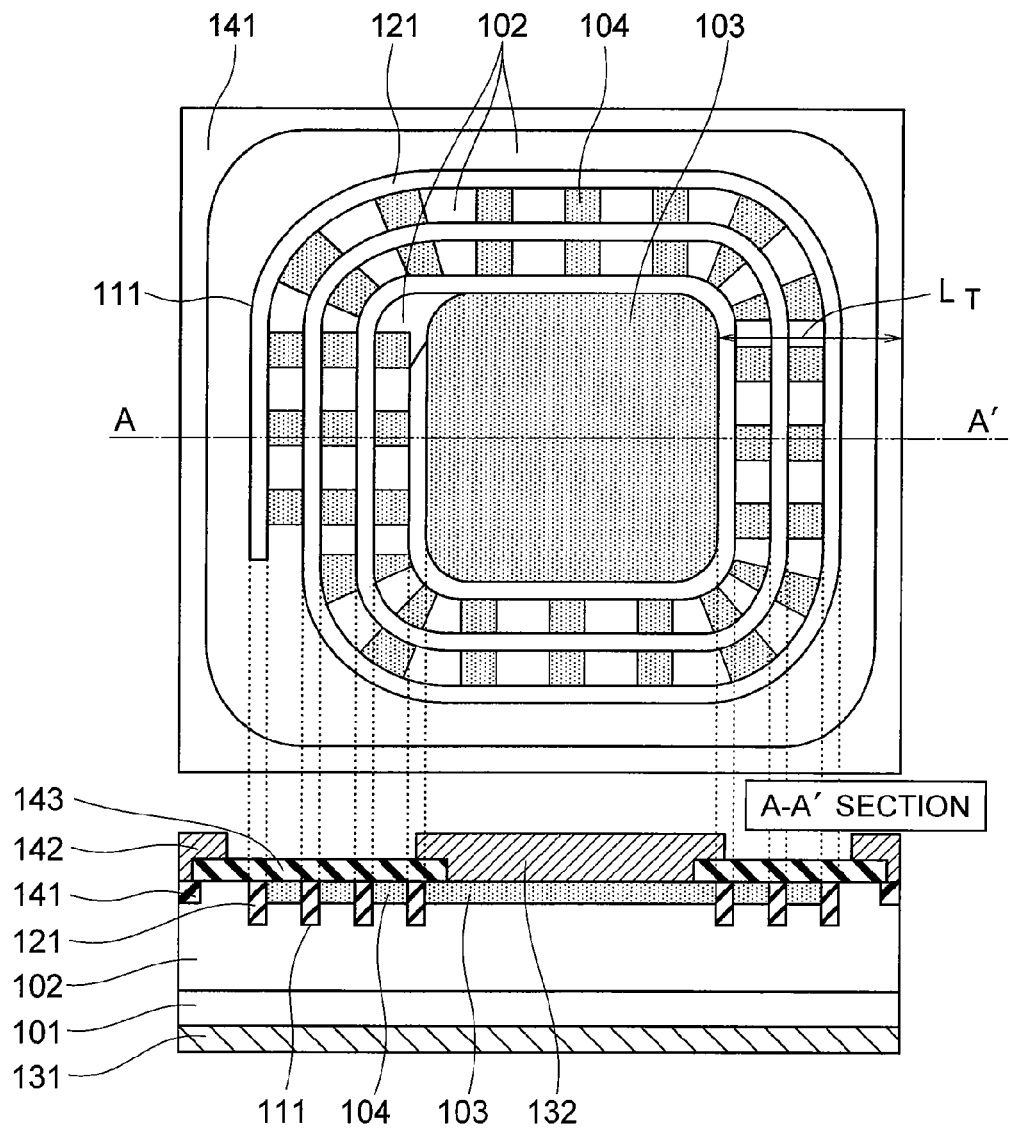
FIG. 1 is a plan view and a cross sectional view schematically showing a configuration of a power semiconductor device according to a first embodiment.

Embodiments of a power semiconductor device according to the present invention will be described with reference to the drawings. In the embodiments described hereafter, a first conductivity type is an n-type and a second conductivity type is a p-type. However, the first and second conductivity types may be a p-type and an n-type, respectively. The same parts in the drawings are denoted by the same numerals.

(First Embodiment)

FIG. 1 is a plan view and a cross sectional view schematically showing a configuration of a power semiconductor device according to a first embodiment. The cross sectional view shows a cross section obtained by cutting the power semiconductor device along an A-A' line shown in the plan view.

The power semiconductor device shown in FIG. 1 is a vertical diode, and includes an n+ semiconductor substrate 101 as an example of a first semiconductor layer, an n− semiconductor layer 102 as an example of a second semiconductor layer, a p anode layer 103 as an example of a third semiconductor layer, guard ring layers 104 as an example of fourth semiconductor layers, a trench 111, an insulator 121, a cathode electrode 131 as an example of a first main electrode, and an anode electrode 132 as an example of a second main electrode.

The power semiconductor device shown in FIG. 1 further includes a field stop layer 141, a field stop electrode 142, and a field insulator 143.

In FIG. 1, the n− semiconductor layer 102 is formed on the n+ semiconductor substrate 101, and the p anode layer 103 is selectively formed on a surface of the n− semiconductor layer 102. The cathode electrode 131 is electrically connected to the n+ semiconductor substrate 101, and the anode electrode 132 is electrically connected to the p anode layer 103. In the present embodiment, the n+ layer 101 is a substrate, and the n− layer 102 is formed on one side of the substrate by crystal growth. Alternatively, the n− layer 102 may be a substrate, and the n+ layer 101 may be formed on one side of the substrate by impurity diffusion.

The power semiconductor device shown in FIG. 1 includes a device part that is a region in which a current flows in the ON state and a terminal part that is a peripheral region of the device part.

In FIG. 1, a region where the p anode layer 103 is provided is the device part, and a peripheral region of the p anode layer 103 is the terminal part.

The field stop layer 141 and the field stop electrode 142 are formed in the terminal part to prevent a depletion layer from extending to chip sidewalls. The field insulator 143 is formed between the field stop electrode 142 and the anode electrode 132.

The trench 111 is formed in the periphery of the p anode layer 103 on the surface of the n− semiconductor layer 102. When viewed from above the n− semiconductor layer 102, the trench 111 is formed in a vortex shape so as to surround the p anode layer 103. The insulator 121 is buried in the trench 111. As shown in the cross sectional view, the depth of the bottom surface of the trench 111 is deeper than the bottom surface of the p anode layer 103, and shallower than the top surface of the n+ semiconductor substrate 101. As shown in the plan view and the cross sectional view, the trench 111 is in contact with side surfaces of the p anode layer 103. In the present embodiment, a part of the trench 111 in the vicinity of the tip of the trench 111 is in contact with the side surfaces of the p anode layer 103 so as to surround the p anode layer 103.

In FIG. 1, the trench 111 is formed in the vortex shape. Therefore, the n− semiconductor layer 102 has a region sandwiched between parts of the trench 111. In this region, a plurality of guard ring layers 104 are selectively formed on the surface of the n− semiconductor layer 102. In this region, the n− semiconductor layer 102 and the guard ring layers 104 are alternately exposed to the surface. The guard ring layers 104 are p-type semiconductor layers, similarly to the p anode layer 103.

In the present embodiment, the terminal length can be shortened while maintaining the high breakdown voltage by forming such a vortex-shape trench 111. In FIG. 1, the terminal length is denoted by $L_T$. If a high voltage is applied to the vertical diode when the power semiconductor device shown in FIG. 1 is in the OFF state, the depletion layer extends from the p anode layer 103 to the terminal part. In the terminal part, the depletion layer extends not only in the vertical direction of the n− semiconductor layer (drift layer) 102, but also in the horizontal direction toward the chip sidewalls.

In the present embodiment, the region sandwiched between the parts of the trench 111 is linked from the p anode layer 103 to the chip sidewalls by a vortex-shape semiconductor layer (the n− semiconductor layer 102 and the guard ring layers 104). Therefore, if a high voltage is applied in the OFF state in the power semiconductor device shown in FIG. 1, the depletion layer extends along the vortex-shape semiconductor layer, and the potential distribution becomes a vortex-shape distribution. At this time, the potential difference between guard ring layers 104 which are adjacent to each other via the trench 111 is held by the insulator 121 in the trench 111. Then, an electric field is generated on the sidewalls of the inside trench 111 as well to hold a voltage. In the vortex-shape semiconductor layer, the n− semiconductor layer 102 and the guard ring layers 104 are disposed alternately and periodically along the vortex. In other words, on the surface of the region sandwiched between the parts of the trench 111, areas where the n− semiconductor layer 102 is exposed and areas where the guard ring layers 104 are exposed are formed alternately along the trench 111.

In the conventional terminal structure, the voltage is held by only the interface between a field insulator and a semiconductor layer. On the other hand, in the terminal structure according to the present embodiment, the voltage is held by the insulator 121 in the trench 111 and the interface between the trench 111 and the semiconductor layer. Therefore, in the present embodiment, the depletion layer for holding the voltage can be lengthened by the length of the trench 111. This is because the depletion layer which holds the voltage extends along the trench 111. Therefore, in the present embodiment, an effective terminal length which is a distance over which the depletion layer can extend becomes long even if the terminal length $L_T$ is shortened, so that a high breakdown voltage can be obtained. Further, in the present embodiment, a plurality of p-type layers are formed in the region sandwiched between the parts of the trench 111 by forming a plurality of guard ring layers 104 in this region, and a large number of pn junction surfaces perpendicular to the direction in which the vortex extends are formed periodically along the vortex. Consequently in the present embodiment, it is possible to suppress the electric field concentration in the direction along the trench 111 to realize a high voltage as compared with the case where the guard ring layers 104 are not formed.

Further, in the present embodiment, the electric field generated in the terminal part becomes small because the effective terminal length is long. As a result, the leak current in the terminal part becomes small. In addition, in the present embodiment, generations of hot carriers and migrations of movable ions are suppressed because the electric field generated in the terminal part becomes small. As a result, a power semiconductor device in which characteristics variations are not apt to occur and the reliability is high can be implemented.

Further, as described above, in the present embodiment, the region sandwiched between the parts of the trench 111 links from the p anode layer 103 to the chip sidewalls via the vortex-shape semiconductor layer which is formed by the n− semiconductor layer 102 and the guard ring layers 104.

Therefore, in the present embodiment, holes injected from the p anode layer 103 into the n− semiconductor layer 102 in the ON state are swiftly exhausted to the p anode layer 103 through a mesa part (the vortex-shape semiconductor layer) in the OFF state. Therefore, fast recovery operation becomes possible in the present embodiment. Further, since the exhausted carriers are not stored in the present embodiment, the electric field distribution in the terminal part does not change even in the dynamic state and a high recovery breakdown voltage can be obtained. Further, even if holes are generated in the terminal part by an avalanche breakdown, the holes are swiftly exhausted to the p anode layer 103 through the mesa part in the present embodiment, so that the holes are not apt to be stored in the terminal part. Therefore, in the present embodiment, a high avalanche breakdown voltage can be obtained. Such an effect cannot be obtained in the case where a concentric trench which is in contact with the whole side surfaces of the p anode layer is provided instead of providing a vortex-shape trench which is in contact with a part of side surfaces of the p anode layer.

Further, in the present embodiment, the terminal length can be shortened and consequently the on-resistance of the chip can be made low. Further, in the present embodiment, the effective terminal length can be made long even if the terminal length is shortened. Therefore, although a shallow trench is adopted in the present embodiment, it is possible to set the terminal length to a short value and set the effective area ratio in the chip to a great value. In the present embodiment, the depth of the bottom surface of the trench 111 is set so as to become deeper than the bottom surface of the p anode layer 103 and shallower than the top surface of the n+ semiconductor substrate 101.

Hereafter, various modifications of the power semiconductor device according to the present embodiment will be described with reference to FIGS. 2 to 7. FIGS. 2 to 7 are plan views and cross sectional views showing configurations of these modifications.

Figure 2:
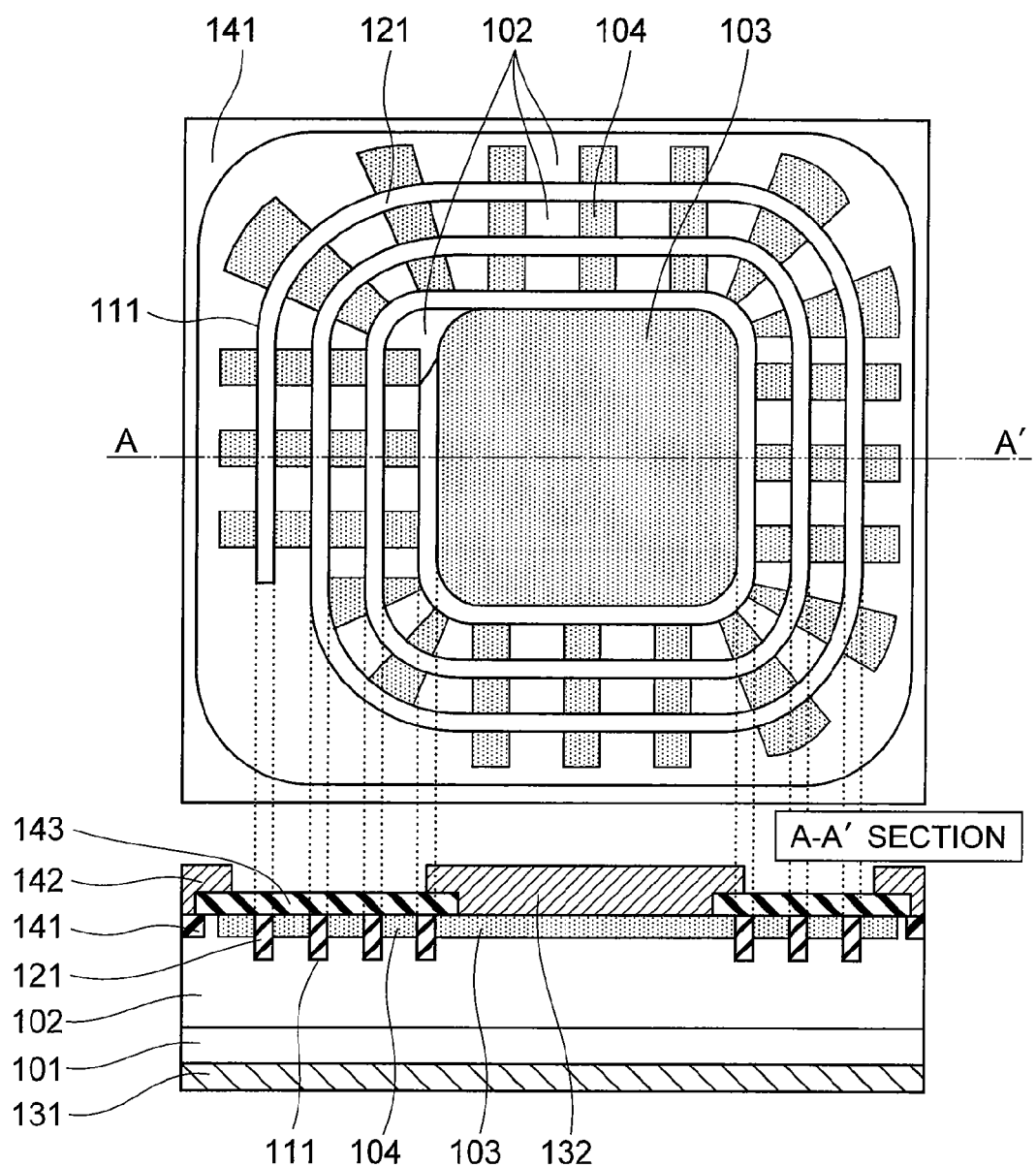
FIGS. 2 to 7 are plan views and cross sectional views schematically showing configurations of modifications of the first embodiment.

In FIG. 1, the guard ring layers 104 are formed only inside the vortex-shape trench 111. On the other hand, in the present embodiment, the guard ring layers 104 may be formed outside the vortex-shape trench 111 as well, as shown in FIG. 2. In FIG. 1, the guard ring layers 104 are formed only inside the region sandwiched between the parts of the trench 111, out of inside and outside the region sandwiched between the parts of the trench 111. In FIG. 2, the guard ring layers 104 are formed inside and outside the region sandwiched between the parts of the trench 111.

Figure 3:
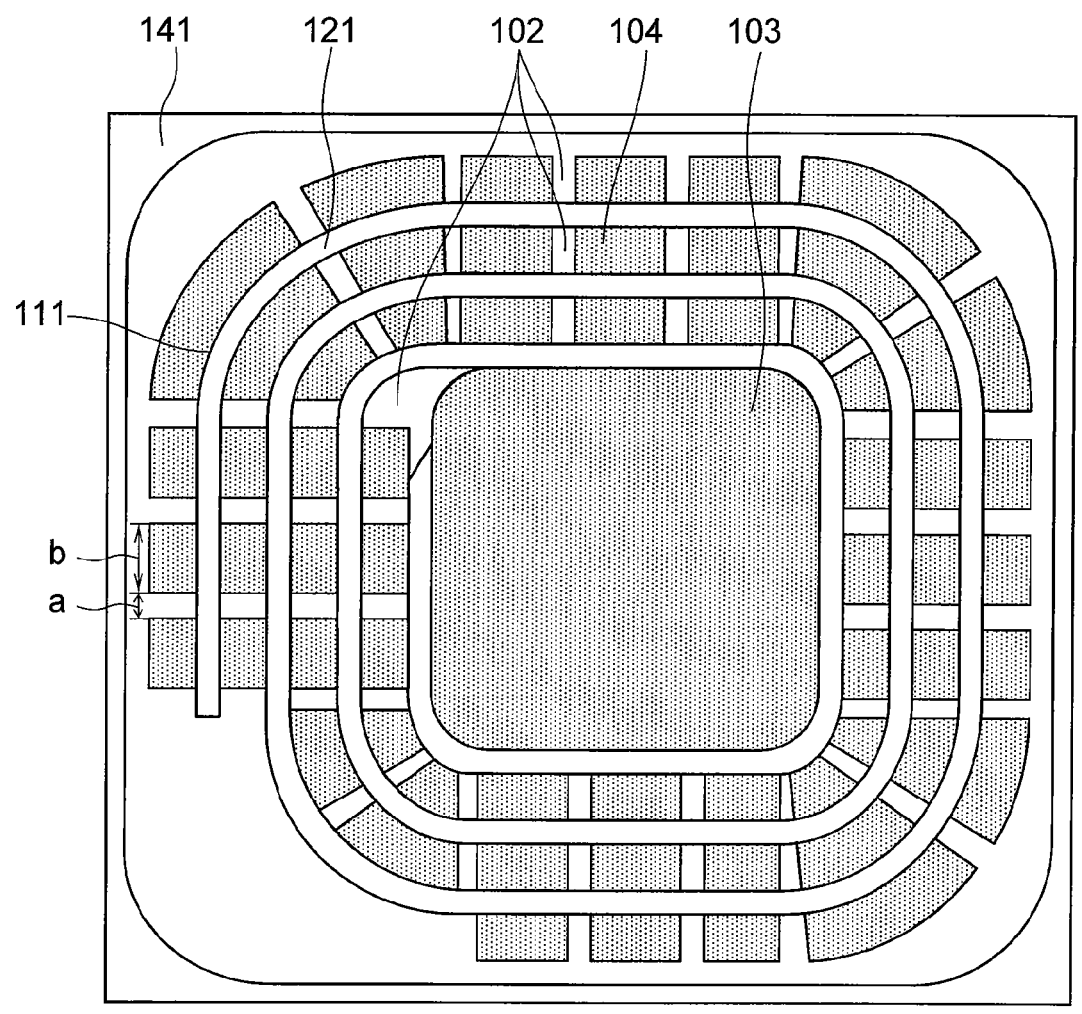

In FIG. 3, a distance between guard ring layers 104 adjacent along the trench 111 is denoted by "a", and the length of each of the guard ring layers 104 disposed along the trench 111 is denoted by "b." In the present embodiment, it is desirable that the distance "a" between the guard ring layers 104 is smaller than the length "b" of each guard ring layer 104. Consequently, a depletion layer can arrive easily from one guard ring layer 104 to an adjacent guard ring layer 104 when the depletion layer extends along the trench 111. This is because this makes it possible to narrow the distance between the guard ring layers 104 without reducing the number of the guard ring layers 104 by making the value of "a" relatively small and making the value of "b" relatively large. Further, since the breakdown electric field of the insulator 121 is typically at least ten times of the critical electric field of silicon, it is desirable that at least ten guard ring layers 104 are formed while the vortex (the trench 111) makes one trip around the p anode layer 103.

Further, a voltage held by the insulator 121 sandwiched between the guard ring layers 104 is equal to a voltage held by the sidewalls of the trench 111. On the other hand, as described above, the breakdown electric field of the insulator 121 is typically at least ten times of the critical electric field. Therefore, it is desirable that the width of the trench 111 is at least one tenth the depth of the trench 111 so as to prevent insulation breakdown at the insulator 121.

Figure 4:
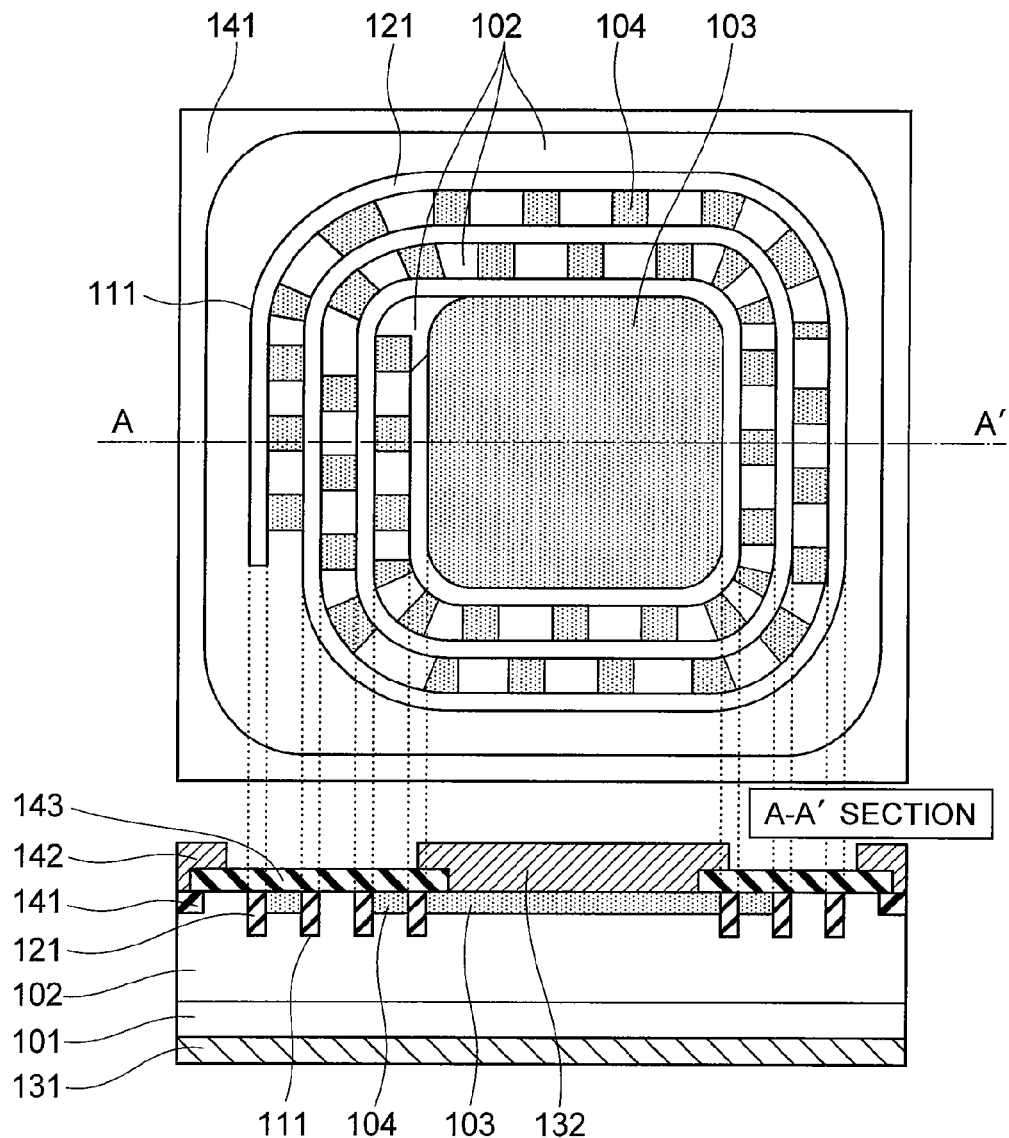

In FIGS. 1 to 3, the guard ring layers 104 are disposed so as to be opposed to each other via the trench 111. However, the above-described effect can also be obtained when another arrangement is adopted. In the present embodiment, the guard ring layers 104 may be arranged in an offset form, for example, as shown in FIG. 4. In other words, each guard ring layer 104 may be disposed so as to be opposed to the n− semiconductor layer 102 via the trench 111, as shown in FIG. 4.

Figure 5:
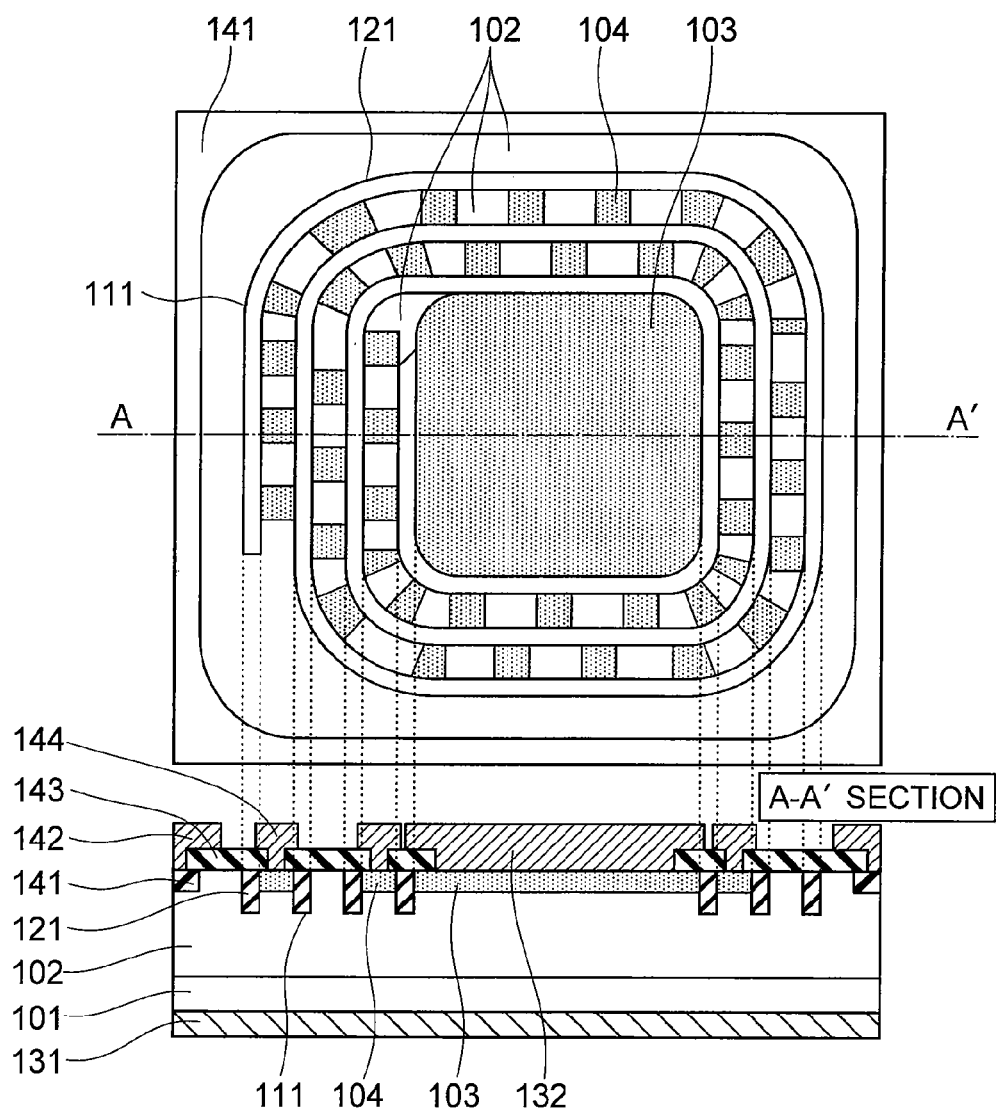

As shown in FIG. 5, the power semiconductor device according to the present embodiment may include a plurality of field plate electrodes 144 electrically connected to the guard ring layers 104. Consequently, in the power semiconductor device, a change of the electric field distribution caused by the influence of charges in the insulator 143 or on the chip surface is not apt to occur, and a high breakdown voltage and high reliability can be obtained. In FIG. 5, one field plate electrode 144 is provided on each guard ring layer 104.

Figure 6:
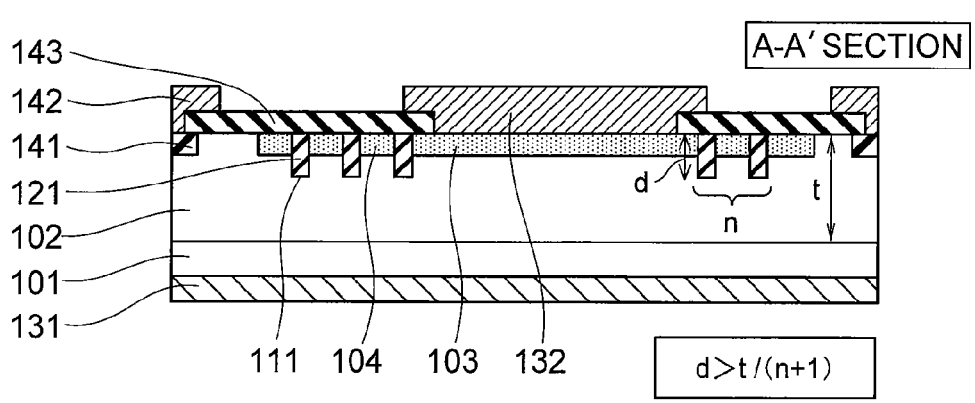

In FIG. 6, the depth of the trench 111 is denoted by "d," the number of pieces of the trench 111 is denoted by "n," and the thickness of the n− semiconductor layer 102 is denoted by "t." However, "n" represents the minimum number of pieces of trench sections which exist on one side of the p anode layer 103 on an arbitrary cross section crossing the p anode layer 103. In FIG. 6, three pieces of trench sections exist on the left side of the p anode layer 103, and two pieces of trench sections exist on the right side of the p anode layer 103, so that "n" is 2.

In the present embodiment, as the trench depth "d" becomes deep, the voltage held by the sidewalls of the trench 111 becomes greater. Therefore, in the present embodiment, as the trench depth "d" becomes deep, the number "n" can be reduced. Since the voltage is held at the sidewalls of the trench 111 and outside of the outermost part of the trench 111, the number of places where the voltage is held becomes equal to the number "n" plus one (i.e., n+1).

In the present embodiment, the voltage in the vertical direction of the n− semiconductor layer 102 is divided and held in the horizontal direction of the terminal part. Therefore, the high breakdown voltage can be held by making the electric field in the vertical direction smaller than the electric field in the horizontal direction. Therefore, it is desirable to make the trench depth "d" greater than a quotient obtained by dividing the thickness "t" of the n− semiconductor layer 102 by the number (n+1) of voltage holding places. In other words, it is desirable that the relation d>t/(n+1) is satisfied among "d," "t," and "n."

Figure 7:
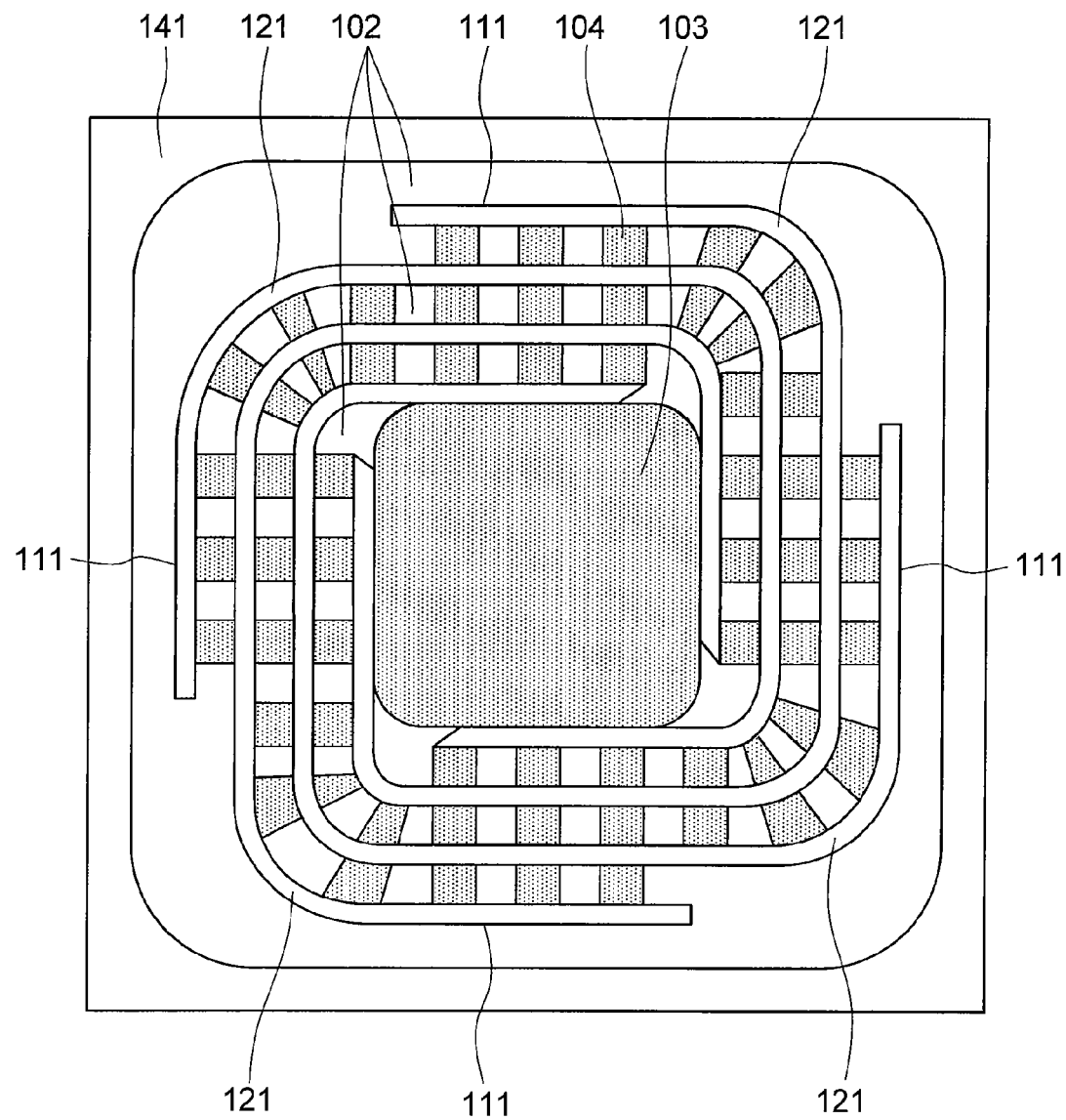

In FIGS. 1 to 6, only one vortex-shape trench 111 is formed in the power semiconductor device. On the other hand, in the present embodiment, two or more vortex-shape trenches 111 may be formed in the power semiconductor device as shown in FIG. 7. A total of four trenches 111 are shown in FIG. 7. Although all trenches 111 are in contact with side surfaces of the p anode layer 103, only some of the trenches 111 may be in contact with the side surfaces of the p anode layer 103. The above-described effect described with reference to FIG. 1 can be obtained in the case of FIG. 7 as well. In FIG. 7, the guard ring layers 104 are formed in regions between parts of the trenches 111. In FIG. 7, each of these regions exists between a part of a trench 111 and a part of another trench 111. The trenches 111 are filled with insulators 121 in FIG. 7.

As described above, the power semiconductor device according to the present embodiment includes at least one vortex-shape trench 111, the depth of the bottom surface of the at least one trench 111 is deeper than the bottom surface of the p anode layer 103 and shallower than the top surface of the n+ semiconductor substrate 101, and some or all of the at least one trench 111 is (are) in contact with the side surface of the p anode layer 103. Consequently, in the present embodiment, a low on-resistance and a high breakdown voltage can be implemented with a comparatively short terminal length and a comparatively shallow trench 111.

Hereinafter, power semiconductor devices according to second to sixth embodiments will be described. Since these embodiments are modifications of the first embodiment, differences between these embodiments and the first embodiment will mainly be described below.

(Second Embodiment)

Figure 8:
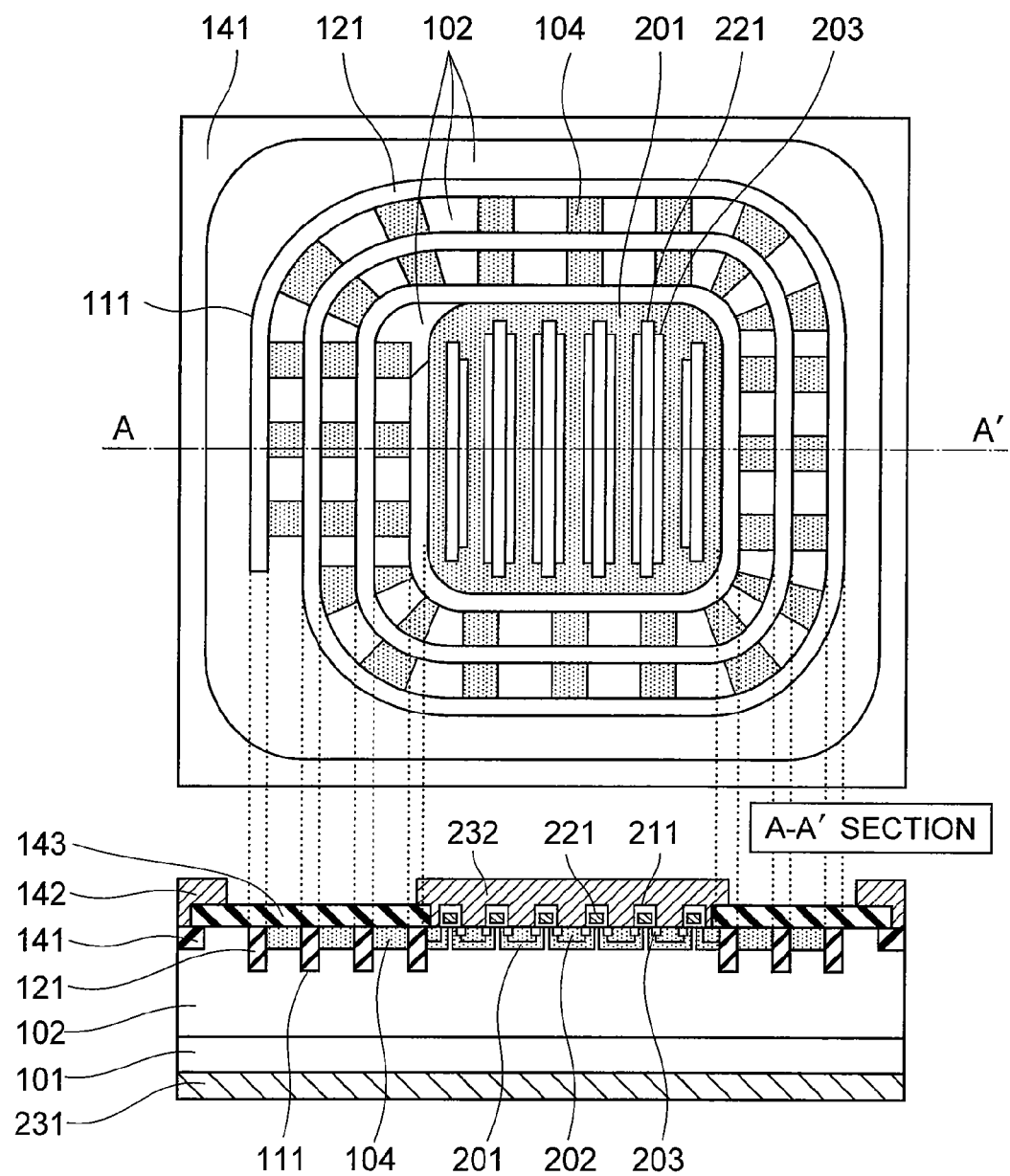
FIG. 8 is a plan view and a cross sectional view schematically showing a configuration of a power semiconductor device according to a second embodiment.

FIG. 8 is a plan view and a cross sectional view schematically showing a configuration of a power semiconductor device according to a second embodiment.

The power semiconductor device shown in FIG. 8 is a vertical power MOSFET, and includes an n+ semiconductor substrate 101 as an example of a first semiconductor layer, an n− semiconductor layer 102 as an example of a semiconductor layer, a p base layer 201 as an example of a third semiconductor layers, p+ contact layers 202, n+ source layers 203, guard ring layers 104 as an example of fourth semiconductor layers, a trench 111, an insulator 121, gate insulators 211, gate electrodes 221 as control electrodes, a drain electrode 231 as an example of a first main electrode, and a source electrode 232 as an example of a second main electrode.

The power semiconductor device shown in FIG. 8 further includes a field stop layer 141, a field stop electrode 142, and a field insulator 143.

In FIG. 8, the n− semiconductor layer 102 is formed on the n+ semiconductor substrate 101, and the p base layer 201 is selectively formed on the surface of the n− semiconductor layer 102. In FIG. 8, in addition, the p+ contact layers 202 are selectively formed on the surface of the p base layer 201, and the n+ source layers 203 are selectively formed on the surfaces of the p base layer 201 and the p+ contact layers 202. The gate electrodes 221 are formed on the n− semiconductor layer 102, the p base layer 201, and the n+ source layers 203 via the gate insulators 211. Furthermore, the drain electrode 231 is electrically connected to the n+ semiconductor substrate 101, and the source electrode 232 is electrically connected to the p base layer 201 and the p+ contact layers 202.

In FIG. 8, the trench 111 is formed on the surface of the n− semiconductor layer 102 in the terminal part, i.e., in the periphery of the p base layer 201. The trench 111 is formed in a vortex shape. Therefore, the n− semiconductor layer 102 includes a region sandwiched between the parts of the trench 111. In this region, a plurality of guard ring layers 104 are selectively formed on the surface of the n− semiconductor layer 102. In the present embodiment, the terminal length can be shortened while keeping the high breakdown voltage by forming such a vortex-shape trench 111, similarly to the first embodiment.

Further, since the trench 111 takes the vortex shape in the present embodiment, the region sandwiched between the parts of the trench 111 is linked from the p base layer 201 to the chip sidewalls by the vortex-shape semiconductor layer (the n− semiconductor layer 102 and the guard ring layers 104). Therefore, even if a high voltage is applied to the vertical power MOSFET and an avalanche breakdown occurs, holes in the terminal part are exhausted swiftly along the vortex-shape semiconductor layer. Therefore, in the present embodiment, a high avalanche breakdown voltage can be obtained. In the vortex-shape semiconductor layer, the n− semiconductor layer 102 and the guard ring layers 104 are arranged alternately and periodically along the vortex. In the vortex-shape semiconductor layer, a large number of pn junction surfaces perpendicular to the direction in which the vortex extends are formed periodically along the vortex.

Figure 9:
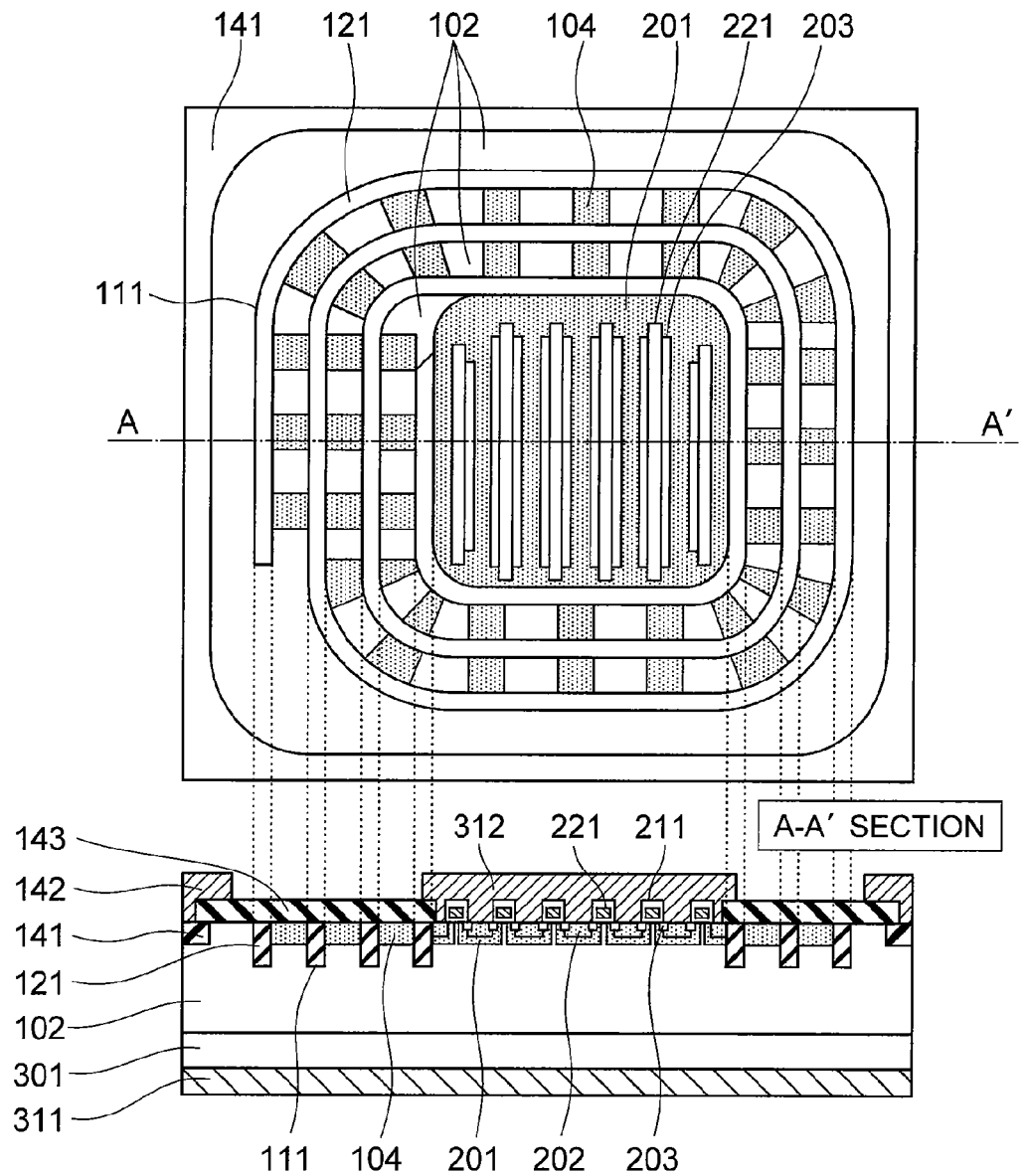
FIG. 9 is a plan view and a cross sectional view showing a configuration of a modification of the second embodiment.

The present embodiment can be applied to not only the power semiconductor device shown in FIG. 8 but also the power semiconductor device shown in FIG. 9. FIG. 9 is a plan view and a cross sectional view schematically showing a configuration of a modification of the power semiconductor device shown in FIG. 8.

The power semiconductor device shown in FIG. 9 is a vertical IGBT, and includes a p+ semiconductor substrate 301 as an example of a first semiconductor layer, an n− semiconductor layer 102 as an example of a semiconductor layer, a p base layer 201 as an example of a third semiconductor layer, p+ contact layers 202, n+ source layers 203, guard ring layers 104 as an example of fourth semiconductor layers, a trench 111, an insulator 121, gate insulators 211, gate electrodes 221 as control electrodes, a collector electrode 311 as an example of a first main electrode, and an emitter electrode 312 as an example of a second main electrode.

Positions of the collector electrode 311 and the emitter electrode 312 are the same as those of the drain electrode 231 and the source electrode 232, respectively.

As described above, the power semiconductor device according to the present embodiment includes at least one vortex-shape trench 111, the depth of the bottom surface of the at least one trench 111 is deeper than the bottom surface of the p base layer 201 and shallower than the top surface of the n+ semiconductor substrate 101, and some or all of the at least one trench 111 is (are) in contact with the side surface of the p base layer 201. Consequently, in the present embodiment, a low on-resistance and a high breakdown voltage can be implemented with a comparatively short terminal length and a comparatively shallow trench 111.

(Third Embodiment)

Figure 10:
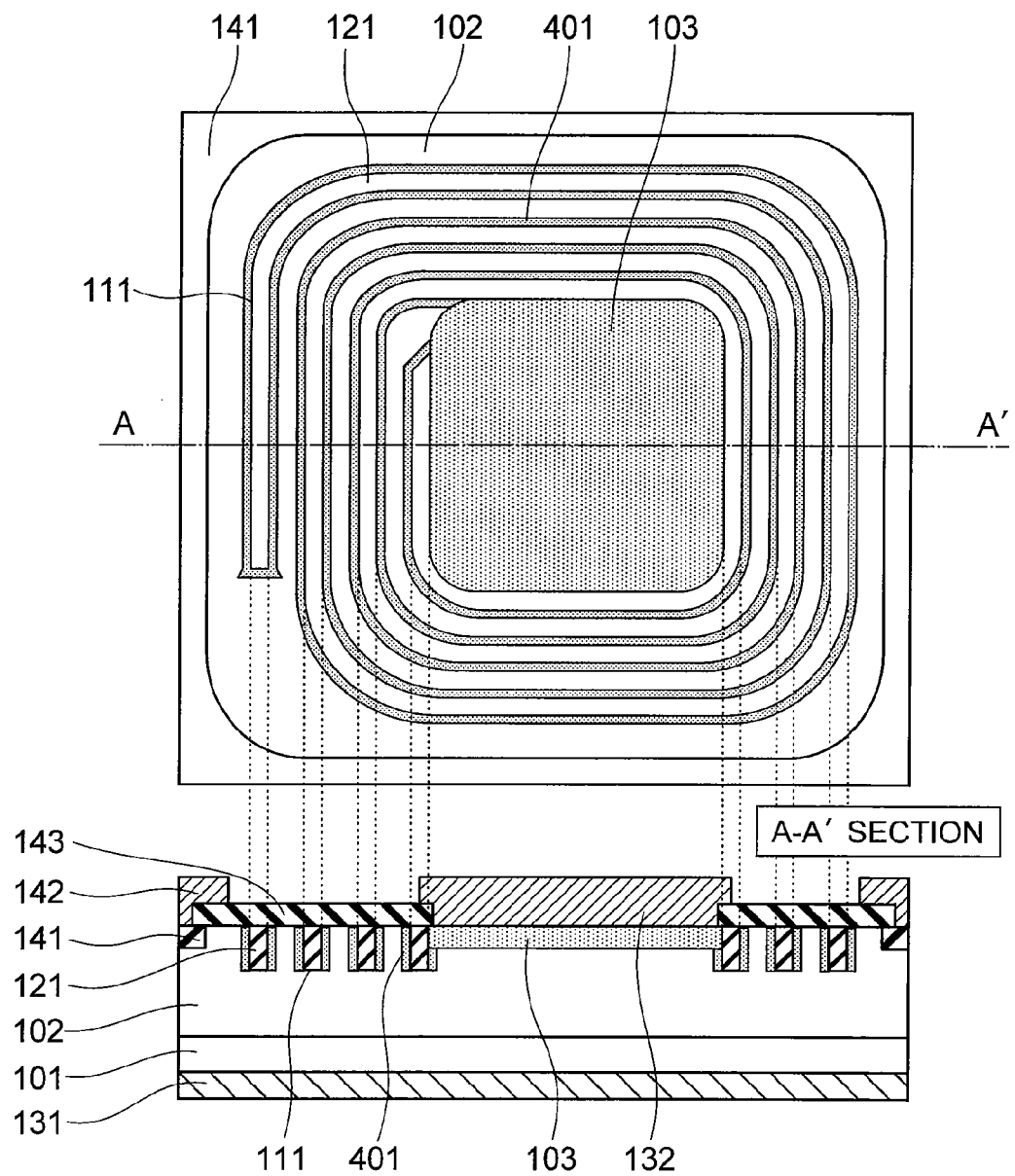
FIG. 10 is a plan view and a cross sectional view schematically showing a configuration of a power semiconductor device according to a third embodiment.

FIG. 10 is a plan view and a cross sectional view schematically showing a configuration of a power semiconductor device according to a third embodiment. The power semiconductor device shown in FIG. 10 is a vertical diode, similarly to the power semiconductor shown in FIG. 1.

In the first embodiment, the guard ring layers 104 are formed in the region sandwiched between the parts of the trench 111. On the other hand, in the present embodiment, a RESURF (Reduced Surface Field) layer 401, which is to be depleted by applying a high voltage, is formed on the sidewalls of the trench 111. The RESURF layer 401 is a p-type semiconductor layer, and an example of a fifth semiconductor layer.

When a high voltage is applied, the RESURF layer 401 is depleted to hold a voltage. As same as the sidewalls of the trench 111 in the first embodiment holds a voltage, the RESURF layer 401 in the present embodiment also holds a voltage. Therefore, according to the present embodiment, the terminal length can be shortened while maintaining the high breakdown voltage. Furthermore, in the present embodiment, a high recovery breakdown voltage and a high avalanche breakdown voltage can be obtained because the trench takes a vortex shape.

In the present embodiment, the potential distribution in the RESURF layer 401 can be flattened by optimizing the impurity concentration in the RESURF layer 401. Consequently, in the direction extending along the trench 111, a flat distribution can be obtained as compared with the case where the guard ring layers 104 are formed. Therefore, in the present embodiment, an electric field concentration is suppressed and it becomes easy to obtain a high breakdown voltage.

Figure 11:
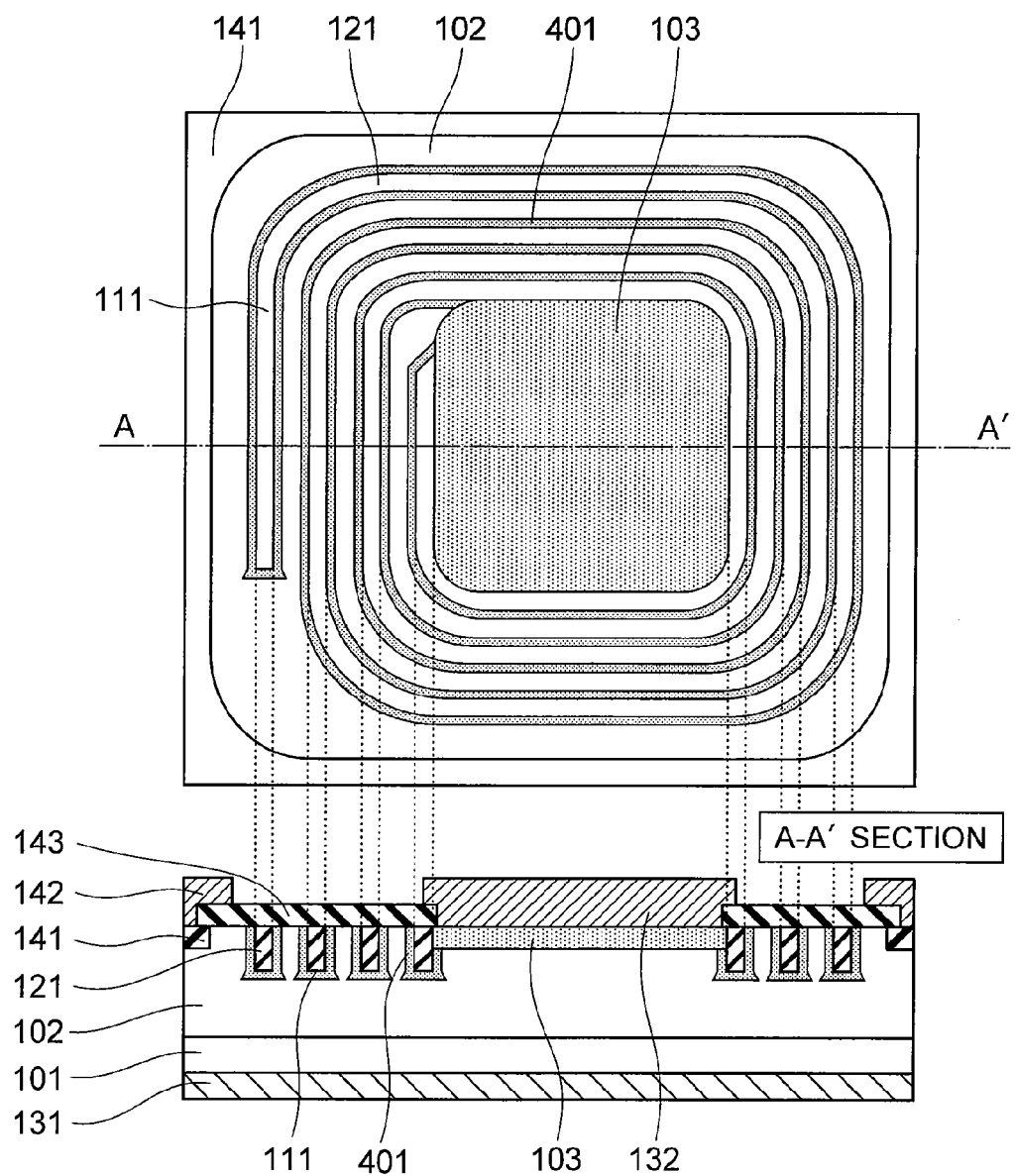
FIG. 11 is a plan view and a cross sectional view showing a configuration of a modification of the third embodiment.

The RESURF layer 401 can be formed by conducting ion injection from an oblique direction after the trench 111 is formed. In FIG. 10, the RESURF layer 401 is formed only on the sidewalls of the trench 111 among the sidewalls and the bottom part. On the other hand, in the present embodiment, the RESURF layer 401 may be formed on the sidewalls and the bottom part of the trench 111 as shown in FIG. 11. FIG. 11 is a plan view and a cross sectional view schematically showing a configuration of a modification of the power semiconductor device shown in FIG. 10.

In the present embodiment, a low on-resistance and a high breakdown voltage can be implemented with a comparatively short terminal length and a shallow trench 111, similarly to the first embodiment. The RESURF layer 401 has an advantage that it can be formed more easily than the guard ring layers 104. On the other hand, the guard ring layers 104 have an advantage that they are not apt to be influenced by dispersion in the manufacturing process as compared with the RESURF layer 401.

(Fourth Embodiment)

Figure 12:
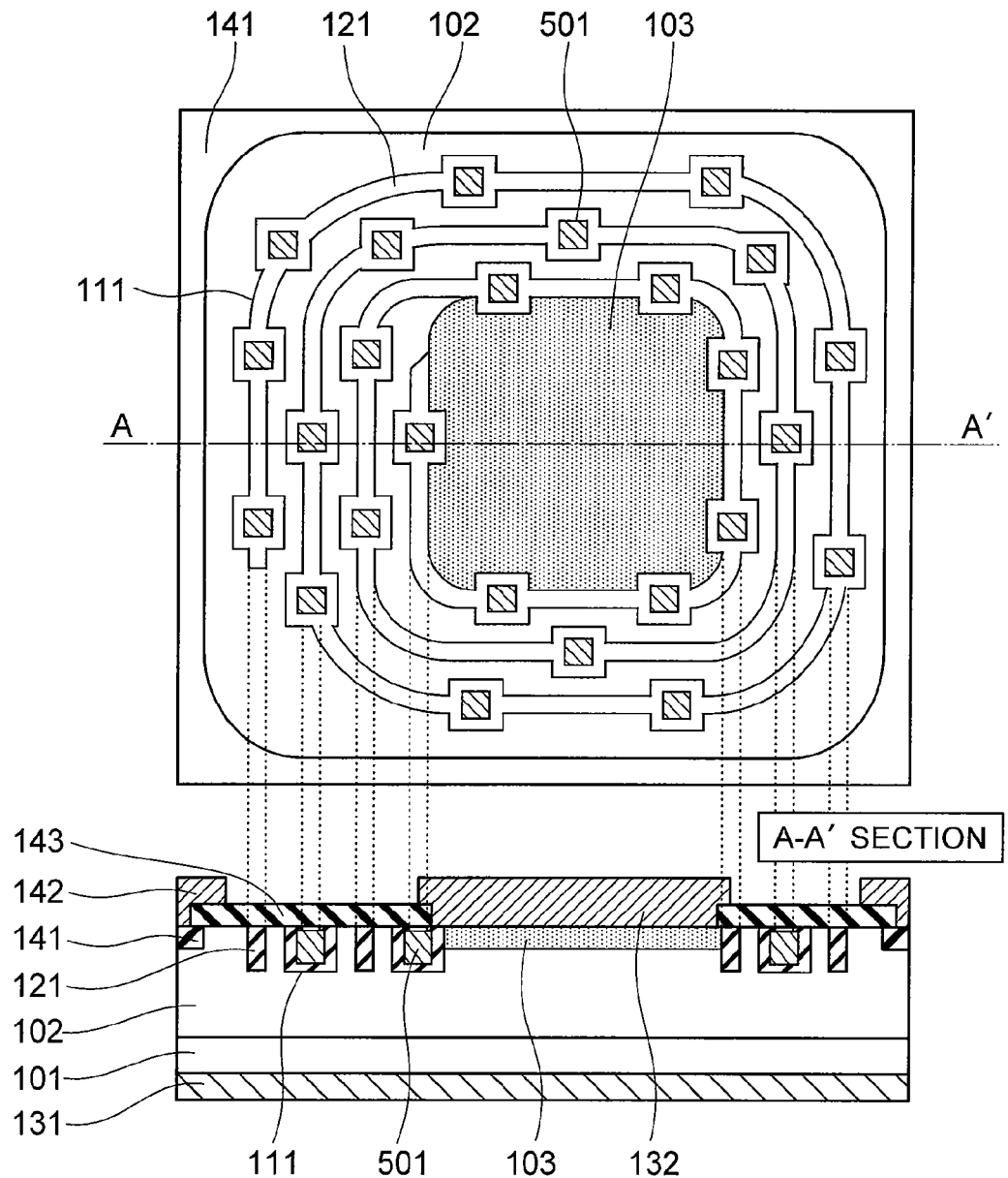
FIG. 12 is a plan view and a cross sectional view schematically showing a configuration of a power semiconductor device according to a fourth embodiment.

FIG. 12 is a plan view and a cross sectional view schematically showing a configuration of a power semiconductor device according to a fourth embodiment. The power semiconductor device shown in FIG. 12 is a vertical diode, similarly to the power semiconductor device shown in FIG. 1.

In the first to third embodiments, the guard ring layers 104 or the RESURF layer 401 is provided in the power semiconductor device. On the other hand, in the present embodiment, a plurality of floating electrodes 501 are provided in the power semiconductor device. The floating electrodes 501 are selectively formed in the trench 111, and side surfaces and a bottom surface of each floating electrode 501 are covered by the insulator 121. Therefore, each floating electrode 501 has a potential in a floating state.

In the present embodiment, the depletion layer becomes apt to extend along the trench 111 by forming such floating electrodes 501 when a high voltage is applied, similarly to the case where the guard ring layers 104 are formed. As a result, a high breakdown voltage can be obtained in the present embodiment.

In the present embodiment, a low on-resistance and a high breakdown voltage can be implemented with a comparatively short terminal length and a shallow trench 111, similarly to the first embodiment.

(Fifth Embodiment)

Figure 13:
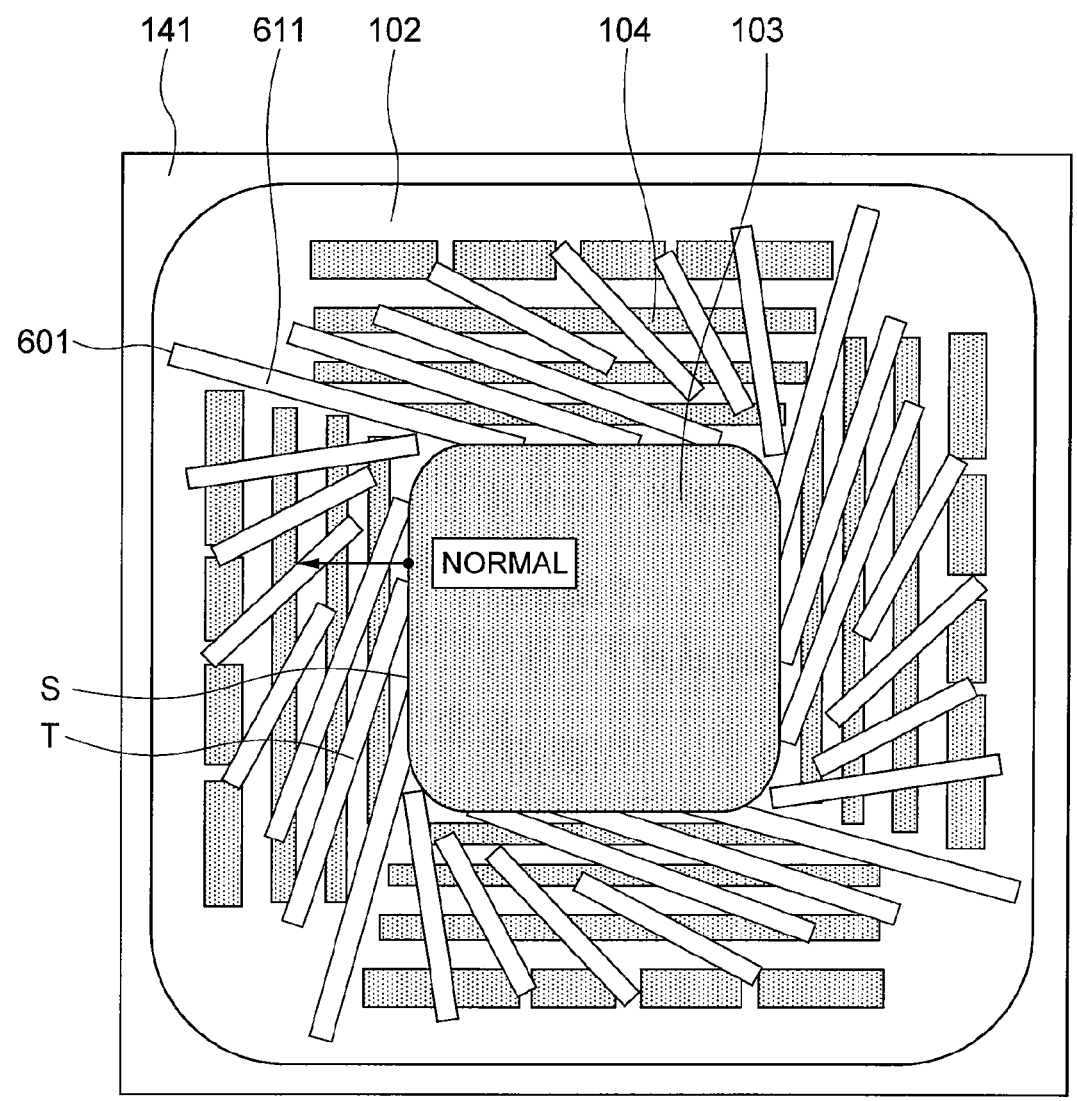
FIG. 13 is a plan view schematically showing a configuration of a power semiconductor device according to a fifth embodiment.

FIG. 13 is a plan view schematically showing a configuration of a power semiconductor device according to a fifth embodiment. The power semiconductor device shown in FIG. 13 is a vertical diode, similarly to the power semiconductor device shown in FIG. 1.

The power semiconductor device shown in FIG. 1 includes one trench 111 formed so as to have the shape of a vortex, whereas the power semiconductor device shown in FIG. 13 includes a plurality of trenches 601 formed so as to each have a straight line shape.

In FIG. 13, these trenches 601 are formed on the surface of the n– semiconductor layer 102 in the periphery of the p anode layer 103. When viewed from above the n– semiconductor layer 102, these trenches 601 are formed so as to each take a rectilinear shape (straight line shape) and surround the p anode layer 103. Insulators 611 are buried in the trenches 601 in FIG. 13, as same as the insulator 121 is buried in the trench 111 in FIG. 1.

Similarly to the trench 111, the depth of the bottom surface of each trench 601 is set so as to become deeper than the bottom surface of the p anode layer 103 and shallower than the top surface of the n+ semiconductor substrate 101. As shown in FIG. 13, some of the trenches 601 are in contact with the side surfaces of the p anode layer 103, similarly to the trench 111. In the present embodiment, first ends of these trenches are in contact with the side surfaces of the p anode layer 103, and second ends of these trenches are not in contact with the side surfaces of the p anode layer 103. In FIG. 13, all of the trenches 601 may be in contact with the side surfaces of the p anode layer 103.

In FIG. 13, each trench 601 is formed so as to extend from the vicinity of a side surface of the p anode layer 103 toward the periphery of the p anode layer 103. The direction in which each trench 601 extends is inclined from a normal line of the side surface of the p anode layer 103. For example, in FIG. 13, a trench denoted by T extends from a side surface denoted by S toward the periphery. The direction in which the trench T extends is neither parallel nor perpendicular to the normal line of the side surface S, and is inclined to the normal line of the side surface S.

In this way, the trenches 601 are formed from the p anode layer 103 toward the filed stop layer 141 not perpendicularly but obliquely. As a result, in the present embodiment, while the voltage is applied in a direction perpendicular to the p anode layer 103 and the field stop layer 141, the depletion layer extends in an oblique direction along the trenches 601. Therefore, in the present embodiment, the depletion layer distance becomes longer and a high breakdown voltage can be obtained even if the terminal length is short.

Further, in the present embodiment, the electric field generated in the terminal part becomes small because the depletion layer distance is long. As a result, the leak current in the terminal part becomes small. Furthermore, in the present embodiment, generations of hot carriers and migrations of movable ions are suppressed, because the electric field generated in the terminal part becomes small. As a result, a power semiconductor device in which characteristics variations are not apt to occur and the reliability is high can be implemented.

Further, in the present embodiment, the trenches 601 are formed so as not to be in contact with the whole side surfaces of the p anode layer 103 but so as to be in contact with only a part of the side surfaces of the p anode layer 103.

Therefore, in the present embodiment, holes injected from the p anode layer 103 into the n– semiconductor layer 102 in the ON state are swiftly exhausted to the p anode layer 103 through mesa parts (the n– semiconductor layers 102 and the guard ring layers 104 sandwiched between the trenches 601) in the OFF state, as same as the holes are exhausted through the vortex-shape semiconductor layer in the first embodiment. Consequently, fast recovery operation becomes possible in the present embodiment. Further, since exhausted carriers are not stored in the present embodiment, the electric field distribution in the terminal part does not change even in the dynamic state and a high recovery breakdown voltage can be obtained. Even if holes are generated in the terminal part by an avalanche breakdown, the holes are swiftly exhausted to the p anode layer 103 through the mesa parts in the present embodiment and consequently holes are not apt to be stored in the terminal part (similarly to the first embodiment). Consequently, in the present embodiment, a high avalanche breakdown voltage can be obtained. Such an effect cannot be obtained in the case where trenches in contact with the whole side surfaces of the p anode layer are provided instead of providing trenches in contact with only a part of the side surfaces of the p anode layer.

The trench structure in the present embodiment has an advantage that the holes are more easily exhausted compared with those in the first to third embodiments.

Figure 14:
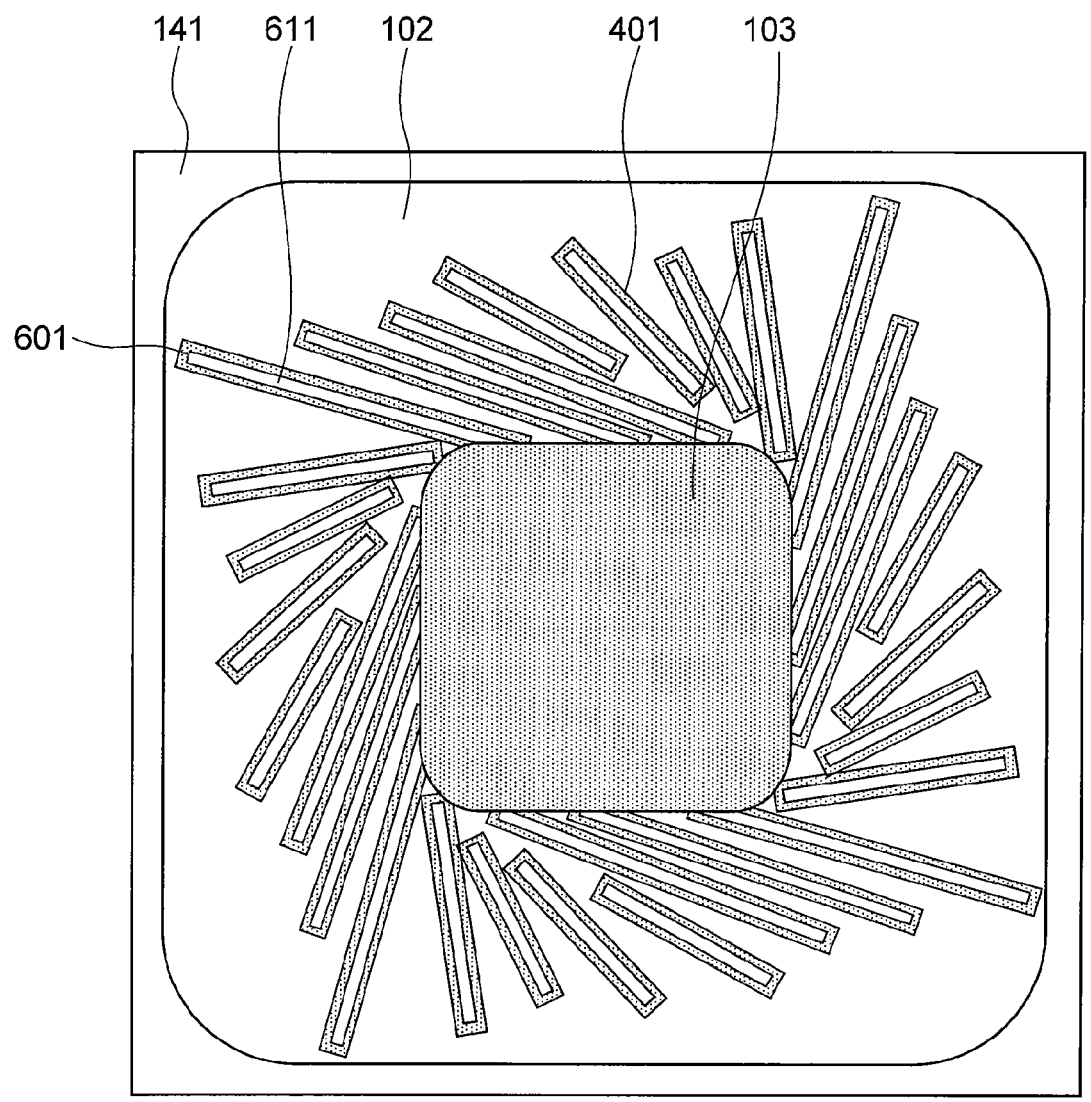
FIGS. 14 to 15 are plan views showing configurations of modifications of the fifth embodiment.
Figure 15:
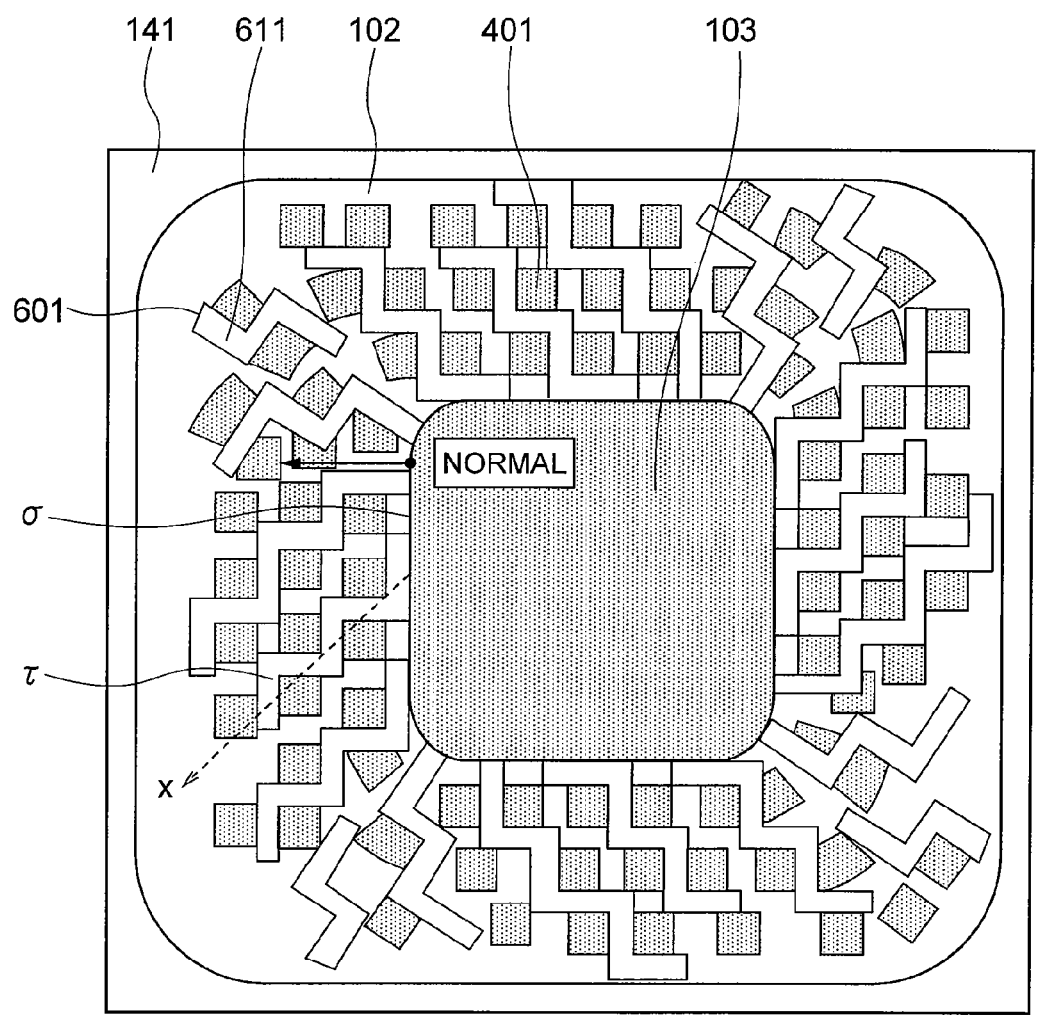

Hereafter, various modifications of the power semiconductor device according to the present embodiment will be described with reference to FIGS. 14 and 15. FIGS. 14 and 15 are plan views schematically showing configurations of these modifications.

In FIG. 13, the guard ring layers 104 are formed in the region sandwiched between the trenches 101, whereas RESURF layers 401 to be depleted by application of a high voltage are formed on sidewalls of the trenches 601 in FIG. 14. In FIG. 14, the depletion layer extends along the trenches 601, and consequently effects similar to those in the case of FIG. 13 are obtained. The RESURF layers 401 are formed on the whole of four side surfaces of each trench 601. In FIG. 14, the RESURF layers 401 may be formed on the sidewalls and the bottom part of each trench 601. In FIG. 14, the RESURF layers 401 may be formed in the whole terminal part.

In the present embodiment, the power semiconductor device may include a plurality of trenches 601 formed so as to each have a curve line shape (a curvilinear shape). Specifically, each of the trenches 601 in FIG. 15 is formed stepwise.

In FIG. 15, each of the trenches 601 is formed so as to extend from the vicinity of a side surface of the p anode layer 103 toward the periphery of the p anode layer 103. A direction in which each trench 601 extends on the average inclines with respect to a normal line direction of the side surface of the p anode layer 103. For example, in FIG. 15, a trench denoted by τ extends from a side surface denoted by σ toward the periphery. A direction in which the trench τ extends on the average is neither parallel nor parallel to a normal line of the side surface τ, but inclines with respect to the normal line. In FIG. 15, the direction in which the trench τ extends on the average is denoted by X.

The present embodiment can be applied not only to the vertical diode but also to a vertical power MOSFET and a vertical IGBT. The items described with reference to FIGS. 1 to 12 can be applied to the present embodiment as well.

As described above, the power semiconductor device according to the present embodiment includes a plurality of trenches 601 having straight or curve line shapes, the depth of the bottom surface of each trenches 601 is deeper than the bottom surface of the p anode layer 103 and shallower than the top surface of the n+ semiconductor substrate 101, and some or all of trenches 601 are in contact with the side surfaces of the p anode layer 103. Therefore, in the present embodiment, a low on-resistance and a high breakdown voltage can be implemented with a comparatively short terminal length and shallow trenches 601.

(Sixth Embodiment)

Figure 16:
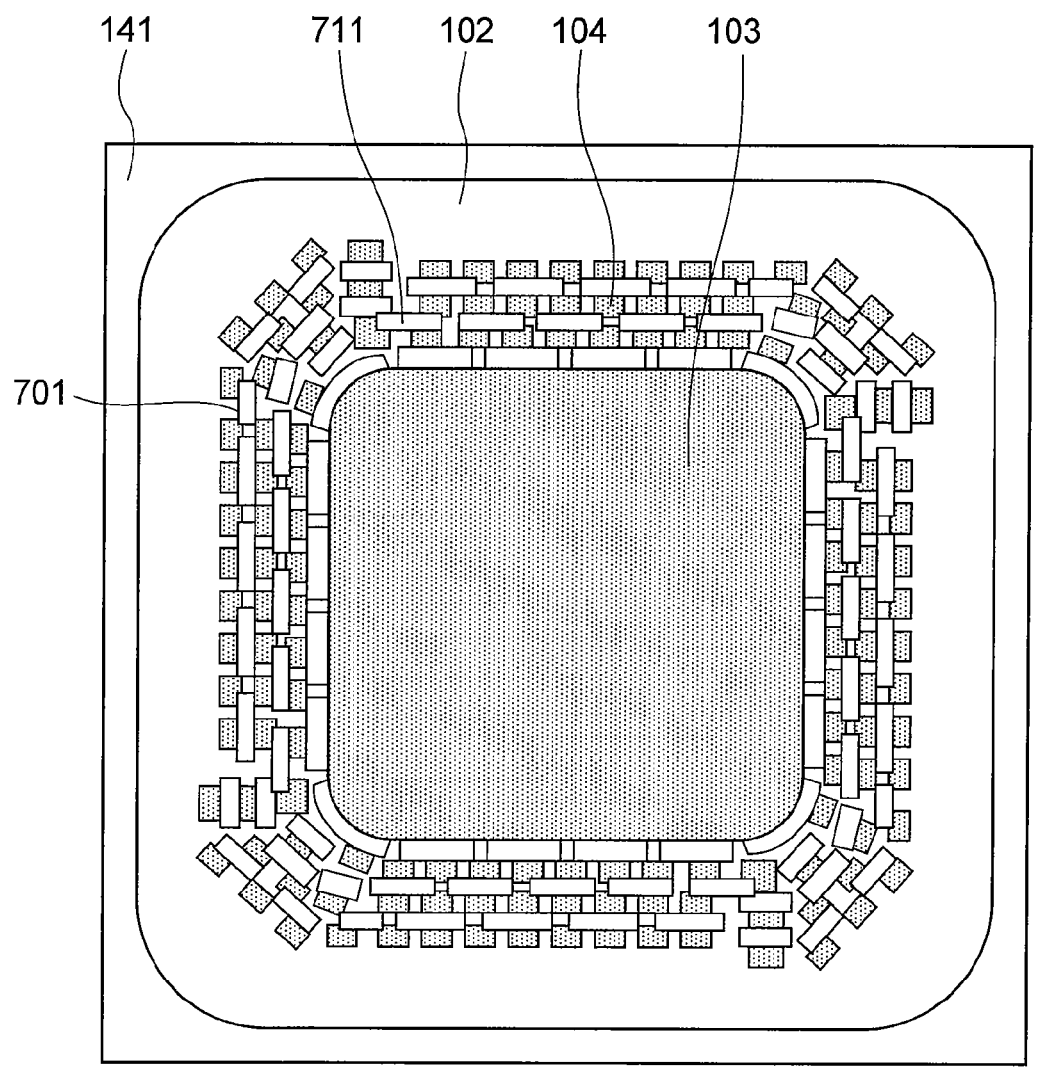
FIG. 16 is a plan view schematically showing a configuration of a power semiconductor device according to a sixth embodiment.

FIG. 16 is a plan view schematically showing a configuration of a power semiconductor device according to a sixth embodiment. The power semiconductor device shown in FIG. 16 is a vertical diode, similarly to the power semiconductor device shown in FIG. 1.

The power semiconductor device shown in FIG. 1 includes one trench 111 formed so as to have the shape of a vortex, whereas the power semiconductor device shown in FIG. 16 includes a plurality of trenches 701 formed so as to have dashed line shapes.

In FIG. 16, these trenches 701 are formed on the surface of the n− semiconductor layer 102 in the periphery of the p anode layer 103. When viewed from above the n− semiconductor layer 102, these trenches 701 are formed so as to take dashed line shapes and surround the p anode layer 103. Insulators 711 are buried in the trench 701 in FIG. 16, as same as the insulator 121 is buried in the trench 111 in FIG. 1.

Similarly to the trench 111, the depth of the bottom surface of each trench 701 is set so as to become deeper than the bottom surface of the p anode layer 103 and shallower than the top surface of the n+ semiconductor substrate 101. As shown in FIG. 16, some of the trenches 701 are in contact with the side surfaces of the p anode layer 103, similarly to the trench 111. In the present embodiment, side surfaces in the longitudinal direction of these trenches are in contact with the side surfaces of the p anode layer 103.

In FIG. 16, the trenches 701 are formed in dashed line shapes so as to surround the p anode layer 103. In the power semiconductor device shown in FIG. 16, the depletion layer extends from the p anode layer 103 toward the field stop layer 141 when a high voltage is applied to the vertical diode. In the present embodiment, the pattern of the trenches 701 is set so as to cause the depletion layer to strike against the insulators 711 without fail, when the depletion layer extends in a direction perpendicular to the p anode layer 103 and the field stop layer 141. Therefore, in the present embodiment, a voltage is held in the insulators 711 as well.

Further, in the present embodiment, a voltage is held in the longitudinal direction as well along the trenches 701 without forming an accumulation layer in silicon in contact with the trenches 701, by forming the trenches 701 in dashed line shapes. As a result, in the present embodiment, the surface distance of the terminal part is prolonged. Consequently, in the present embodiment, it is possible to lower the average electric field and implement a high breakdown voltage and high reliability.

Figure 17:
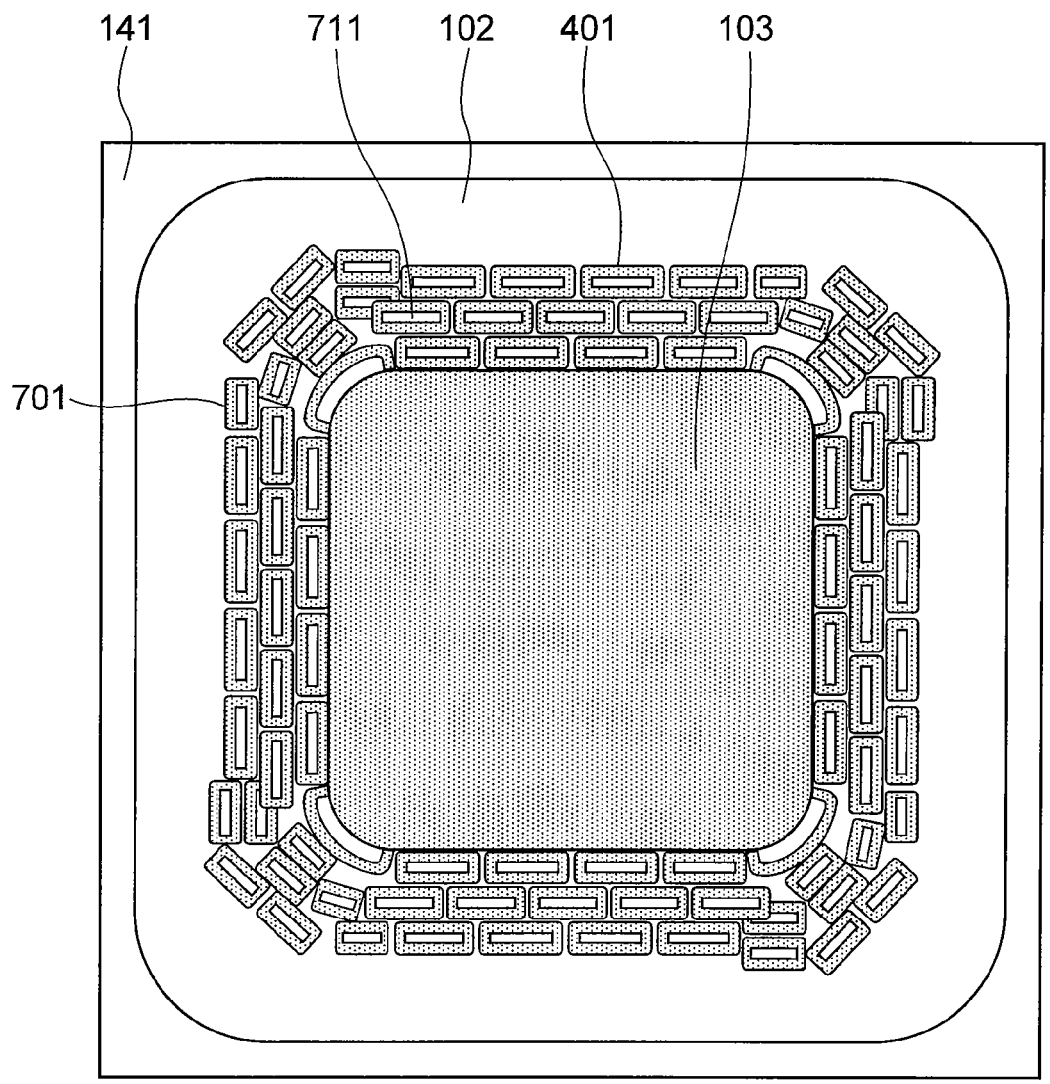
FIG. 17 is a plan view showing a configuration of modification of the sixth embodiment.

Hereafter, a modification of the power semiconductor device according to the present embodiment will be described with reference to FIG. 17. FIG. 17 is a plan view schematically showing a configuration of the modification.

In FIG. 16, the guard ring layers 104 are formed in the region sandwiched between the trenches 701, whereas RESURF layers 401 to be depleted by application of a high voltage are formed on sidewalls of the trenches 701. In FIG. 17, the depletion layer extends along the trenches 701, and consequently effects similar to those in the case of FIG. 16 are obtained. The RESURF layers 401 are formed on the whole of four side surfaces of each trench 701. In FIG. 17, the RESURF layers 401 may be formed on the sidewalls and the bottom part of each trench 701. In FIG. 17, the RESURF layers 401 may be formed in the whole terminal part.

The present embodiment can be applied not only to the vertical diode but also to a vertical power MOSFET and a vertical IGBT. The items described with reference to FIGS. 1 to 12 can be applied to the present embodiment as well.

As described above, the power semiconductor device according to the present embodiment includes a plurality of trenches 701 having a dashed line shape, the depth of the bottom surface of each trench 701 is deeper than the bottom surface of the p anode layer 103 and shallower than the top surface of the n+ semiconductor substrate 101, and some of trenches 701 are in contact with the side surfaces of the p anode layer 103. Consequently, in the present embodiment, a low on-resistance and a high breakdown voltage can be implemented with a comparatively short terminal length and shallow trenches 701.

In the second embodiment, the gate electrodes 221 have a stripe shaped gate pattern. Alternatively, however, the gate electrodes 221 may have a different gate pattern. Examples of such a gate pattern include gate patterns of a mesh form, an offset mesh form, and a honeycomb form.

In the second embodiment, each gate electrode 221 has a planar gate structure. Alternatively, however, each gate electrode 221 may have a different gate structure. An example of such a gate structure includes the trench gate structure.

With reference to the first embodiment, it is described that the width of the trench 111 is desired to be at least one tenth the depth of the trench 111. This condition can be applied not only to a power semiconductor device including the guard ring layers 104, but also to a power semiconductor device including the RESURF layer 401 or the floating electrode 501.

As described above, according to the embodiments of the present invention, it becomes possible to provide a power semiconductor device in which a low on-resistance and a high breakdown voltage can be implemented with a comparatively short terminal length and a shallow trench.

While examples of specific aspects of the present invention have been described above with reference to the first to sixth embodiments, the present embodiment is not restricted to these embodiments.

The invention claimed is:

1. A power semiconductor device comprising:
a first semiconductor layer of a first or second conductivity type;
a second semiconductor layer of the first conductivity type formed on the first semiconductor layer;
a third semiconductor layer of the second conductivity type selectively formed on a surface of the second semiconductor layer;
at least one trench formed in a periphery of the third semiconductor layer on the surface of the second semiconductor layer, a depth of a bottom surface of the at least one trench being deeper than a bottom surface of the third semiconductor layer, and shallower than a top surface of the first semiconductor layer, and some or all of the at least one trench being in contact with a side surface of the third semiconductor layer;
at least one insulator buried in the at least one trench;
a first main electrode electrically connected to the first semiconductor layer; and
a second main electrode electrically connected to the third semiconductor layer;
wherein the at least one trench is formed so as to have a vortex shape when viewed from above the second semiconductor layer.

2. The device according to claim 1, wherein a width of the at least one trench is equal to or larger than one tenth of a depth of the at least one trench.

3. The device according to claim 1, wherein a relation $d > t/(n+1)$ is satisfied where d is a depth of the at least one trench, t is a thickness of the second semiconductor layer, and n is a number of pieces of sections of the at least one trench which exist on one side of the third semiconductor layer on an arbitrary cross section crossing the third semiconductor layer.

4. The device according to claim 1, further comprising:
a floating electrode formed in the at least one trench and having side surfaces and a bottom surface covered by the at least one insulator.

5. The device according to claim 1, further comprising:
a gate electrode formed on the second and third semiconductor layers via a gate insulator.

6. The device according to claim 1, further comprising:
a plurality of fourth semiconductor layers of the second conductivity type selectively formed on the surface of the second semiconductor layer in a region sandwiched between parts of the at least one trench.

7. The device according to claim 6, wherein the fourth semiconductor layers are formed only inside the region sandwiched between the parts of the at least one trench.

8. The device according to claim 6, wherein the fourth semiconductor layers are formed inside and outside the region sandwiched between the parts of the at least one trench.

9. The device according to claim 6, further comprising:
a plurality of field plate electrodes formed on the fourth semiconductor layers and electrically connected to the fourth semiconductor layers.

10. The device according to claim 6, wherein a surface of the region sandwiched between the parts of the at least one trench includes areas where the second semiconductor layer is exposed and areas where the fourth semiconductor layers are exposed, alternately along the at least one trench.

11. The device according to claim 10, wherein a distance between the fourth semiconductor layers adjacent along the at least one trench is shorter than a length of each of the fourth semiconductor layers along the at least one trench.

12. The device according to claim 10, wherein the region sandwiched between the parts of the at least one trench includes at least ten of the fourth semiconductor layers, while the at least one trench makes one trip around the third semiconductor layer.

13. The device according to claim 10, wherein the fourth semiconductor layers are arranged so as to be opposed to different fourth semiconductor layers via the at least one trench.

14. The device according to claim 1, further comprising:
a fifth semiconductor layer of the second conductivity type formed on sidewalls of the at least one trench and to be depleted by applying a predetermined voltage.

15. The device according to claim 14, wherein the fifth semiconductor layer is formed only on the sidewalls of the at least one trench.

16. The device according to claim 14, wherein the fifth semiconductor layer is formed on the sidewalls and a bottom part of the at least one trench.

* * * * *